Oct. 1, 1968 E. METCALF 3,404,294

POLY-STABLE TRANSISTOR CIRCUITS

Filed March 10, 1965 5 Sheets-Sheet 1

INVENTOR
ERIC METCALF
BY
Woodhams, Blanchard & Flynn
ATTORNEYS

INVENTOR
ERIC METCALF
BY
Woodhams, Blanchard & Flynn
ATTORNEYS

INVENTOR
ERIC METCALF
BY
Woodhams, Blanchard & Flynn
ATTORNEYS

Oct. 1, 1968 E. METCALF 3,404,294

POLY-STABLE TRANSISTOR CIRCUITS

Filed March 10, 1965 5 Sheets-Sheet 4

INVENTOR
ERIC METCALF
BY
Woodhams, Blanchard & Flynn
ATTORNEYS

Oct. 1, 1968 E. METCALF 3,404,294

POLY-STABLE TRANSISTOR CIRCUITS

Filed March 10, 1965 5 Sheets-Sheet 5

INVENTOR
ERIC METCALF
BY
Woodhams, Blanchard & Flynn
ATTORNEYS

United States Patent Office 3,404,294

Patented Oct. 1, 1968

3,404,294

POLY-STABLE TRANSISTOR CIRCUITS

Eric Metcalf, Farnborough, England, assignor to The Solartron Electronic Group Limited, Farnborough, England, a British company Filed Mar. 10, 1965, Ser. No. 438,498
Claims priority, application Great Britain, Mar. 18, 1964, 11,510/64
1 Claim. (Cl. 307—288)

ABSTRACT OF THE DISCLOSURE

A penta-stable transistor circuit is disclosed which comprises two bi-stable transistor circuits, the transistors in one circuit being complementary to the transistors in the other circuit and the emitters of the four transistors being connected together. The collector electrodes of the transistors in each bi-stable circuit have a common collector load to which the base electrodes of the transistors in the other bi-stable circuit are connected through impedance elements. The arrangement is such that there are five stable states of the circuit, four of them being the four different combinations of stable states of the two bi-stable circuits and the other being the state in which all four transistors are off.

The present invention relates to poly-stable circuits embodying transistors and is concerned particularly but not exclusively with tri-stable transistor circuits.

Figure 1:
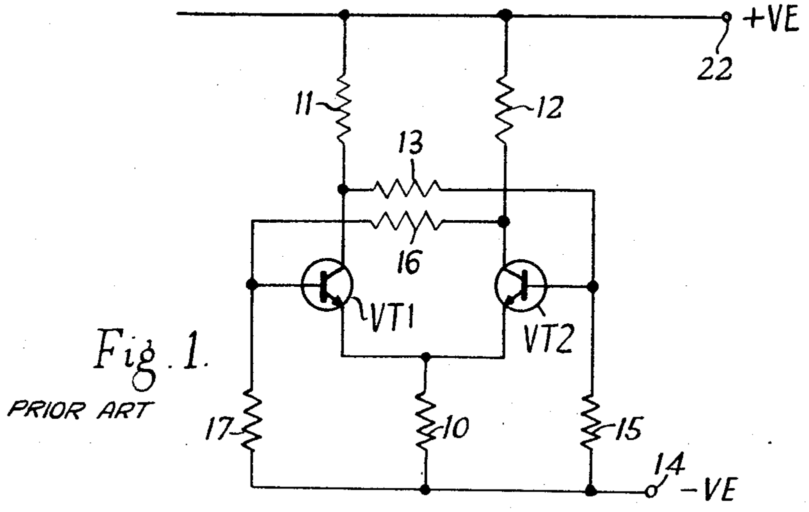

There are two well-known forms of bi-stable transistor circuits. One of these, known as the Eccles-Jordan or symmetrical bi-stable circuit, is basically as shown in FIG. 1 of the accompanying drawings. Two transistors VT1 and VT2 have a common emitter resistor 10 and separate collector resistors 11 and 12. The collector of VT1 is connected through a resistor 13 to the base of VT2 which is connected to the emitter supply terminal 14 through a resistor 15. The collector of VT2 is connected to the base of VT1 through a resistor 16 and the base of VT1 is connected to the terminal 14 through a resistor 17.

In operation, either one of the two transistors is on (conducting) and the other is off (non-conducting). By suitable application of a triggering pulse the transistor which is on becomes switched off, and the transistor which is off becomes switched on.

Figure 2:
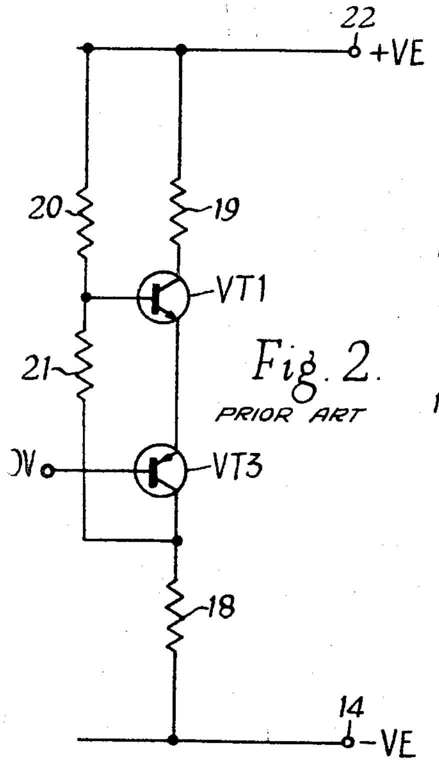

The other well-known bi-stable circuit, known as a complementary bi-stable circuit, is basically as shown in FIG. 2. Two transistors VT1 and VT3 are of complementary types (PNP and NPN) and are connected emitter-to-emitter with their collectors connected through resistors 18 and 19 respectively to the supply terminals. The base of the transistor VT1 is biased from a potential divider 20, 21 connected between the positive supply terminal 22 and the collector of the transistor VT3.

In operation if both VT1 and VT3 are initially off (non-conducting) and a triggering pulse is applied to the base of VT3 to switch it on (conducting) the circuit becomes stable with both transistors on (conducting). Thus in this case in one stable state both transistors are on and in the other stable state both transistors are off.

Hitherto proposals have been made to provide tri-stable circuits and one example of these prior proposals embodies two bi-stable circuits with feedback.

The present invention is based upon the realisation that if the known Eccles-Jordan and complementary bi-stable circuits are combined a tri-stable or penta-stable circuit can be provided utilising three and four transistors respectively.

According to the present invention, therefore, a poly-stable transistor circuit includes an Eccles-Jordan bi-stable transistor circuit having in a common emitter lead thereof a complementary transistor with its emitter connected to the emitters of the transistors in the bi-stable circuit, the arrangement being such that the circuit has two stable states in which the complementary transistor is on together with one or the other of the two transistors in the bi-stable circuit and one stable state in which the three transistors are off.

According to another aspect of the invention a penta-stable transistor circuit comprises two bi-stable transistor circuits, the transistors in one circuit being complementary to the transistors in the other circuit and the emitters of the four transistors being connected together, the collector electrodes of the transistors in each bi-stable circuit having in part of their circuits a common collector load to which the base electrodes of the transistors in the other bi-stable circuit are connected through impedance elements, and the arrangement being such that there are five stable states of the circuit, four of them being the four different combinations of stable states of the two bi-stable circuits and the other being the state in which all four transistors are off.

Figure 3:
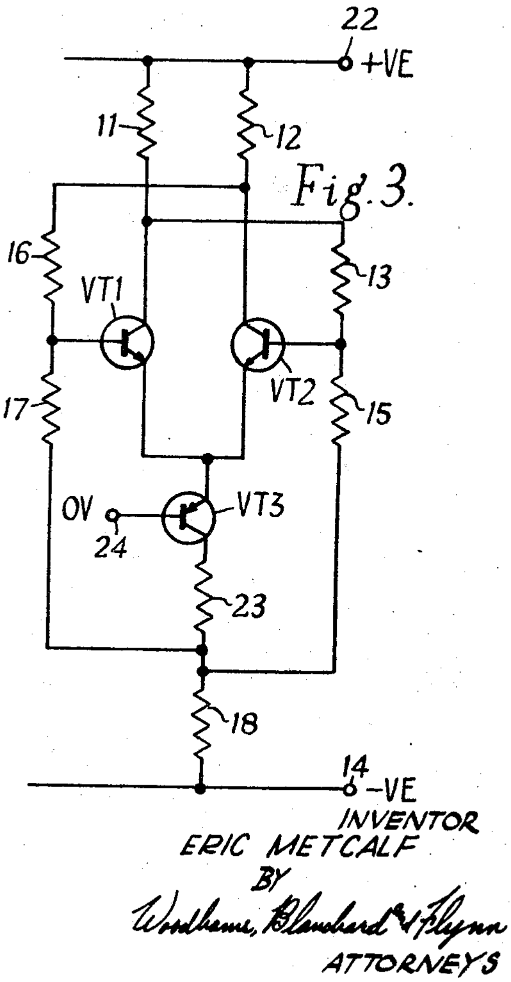
Figure 6:
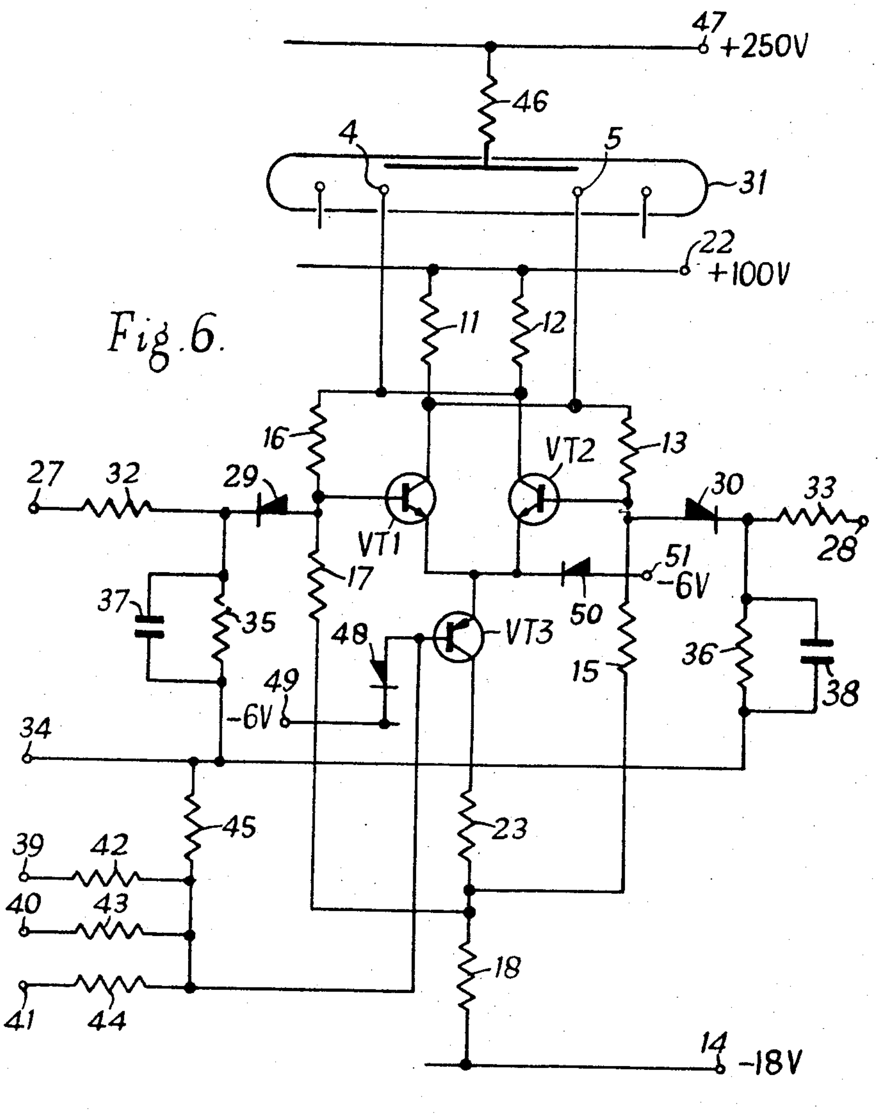
Figure 7:
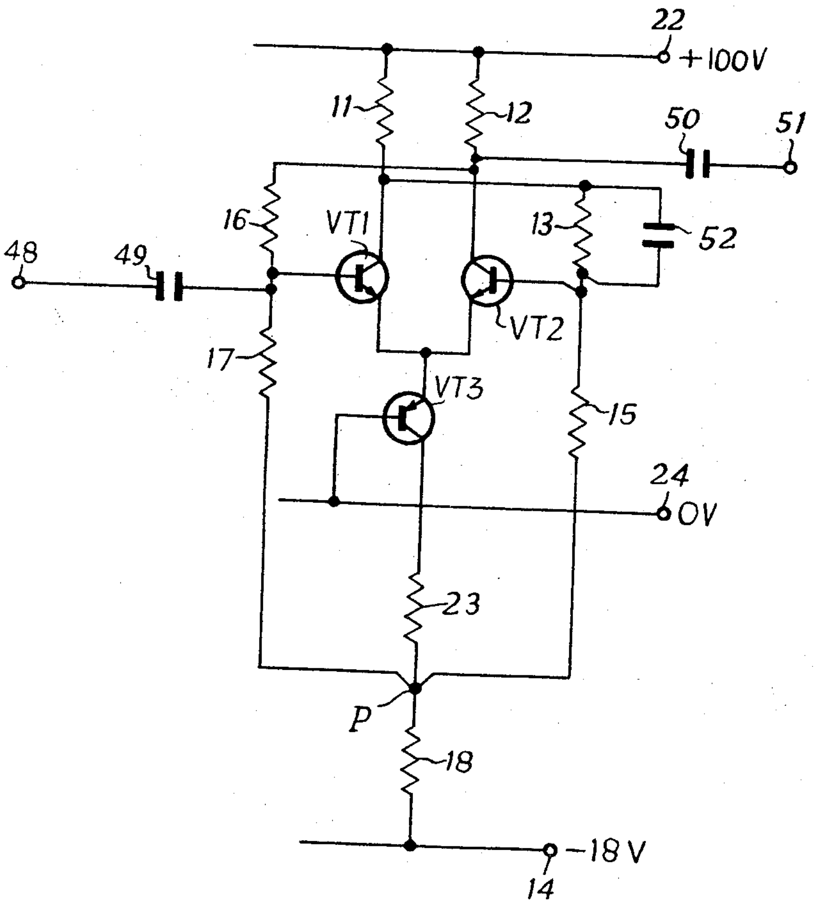
Figure 8:
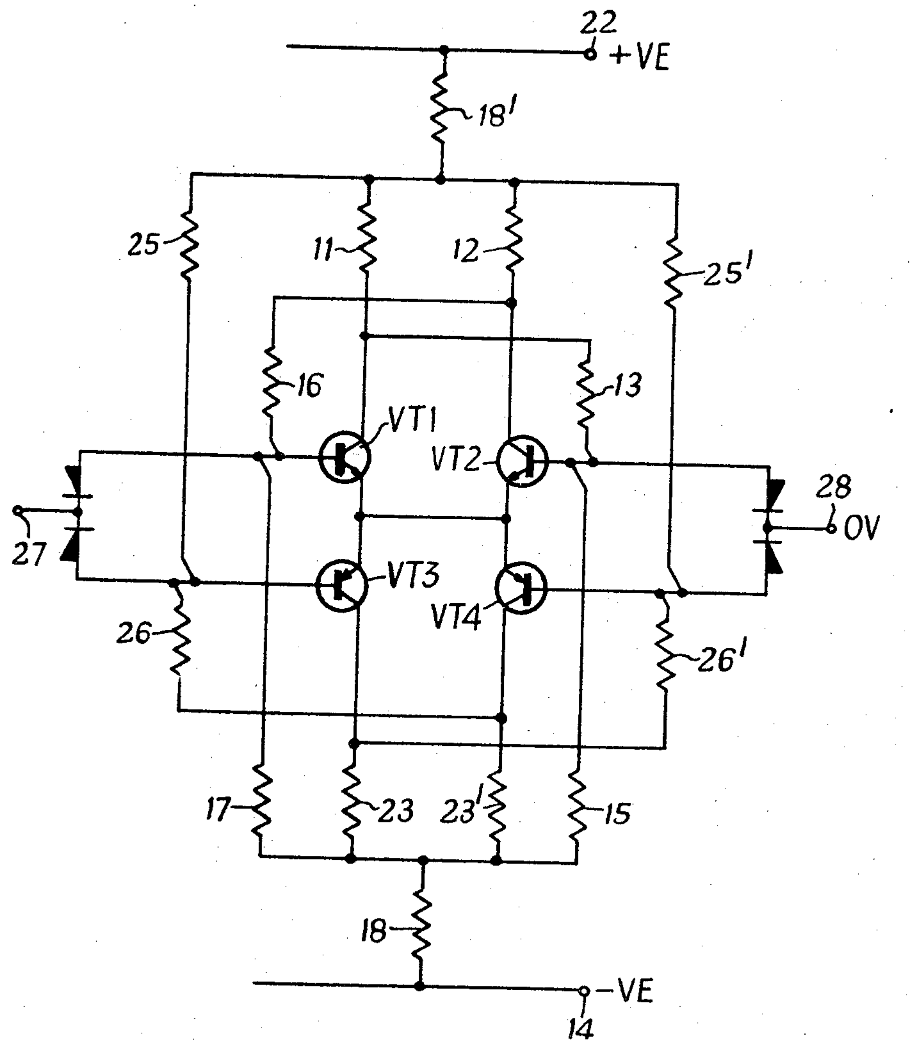

The invention will now be described by way of example with reference to FIGS. 3 to 8 of the accompanying drawings, in which FIG. 3 is a basic circuit diagram of a tri-stable circuit according to the invention, FIGS. 4 and 5 each show a modification of the basic circuit of FIG. 3, FIG. 6 is a circuit diagram of a tri-stable circuit according to the invention in conjunction with a numeral indicator of the glow-discharge type, FIG. 7 is a circuit diagram of a tri-stable circuit according to the invention suitable for use in a ring-counter, and FIG. 8 is a basic circuit diagram of a penta-stable circuit according to the invention.

Throughout the drawings like parts have the same reference.

Referring to FIG. 3 a tri-stable circuit comprises a bi-stable circuit including the transistors VT1 and VT2 with associated collector resistors 11 and 12 and coupling resistors 13, 15, 16 and 17 as in FIG. 1. In place of the resistor 10 of FIG. 1 there is provided the complementary transistor VT3 with its collector resistor 18 and a further resistor 23 connected between the collector of the transistor VT3 and the resistor 18. The resistors 15 and 17 of the bi-stable circuit are connected to the junction of the resistor 18 with the resistor 23.

The base of the transistor VT3 is connected to an input terminal 24 normally at earth potential.

In operation, if the three transistors are initially non-conducting, the application of a negative-going triggering pulse to the terminal 24 will result in the action described with reference to FIG. 2 and VT3 with either VT1 or VT2 assume a stable state in which they are switched on. By holding the base of either VT1 or VT2 positive during the triggering pulse by means of an externally applied signal it is possible to predetermine which of the two transistors VT1 and VT2 is switched on with VT3. Whichever of the two transistors VT1 and VT2 is switched on with the transistor VT3 can be switched off and the other switched on by applying an appropriate triggering pulse to the transistor which is off. Finally by applying a positive pulse to the base of VT3 all three transistors can be switched off.

Thus the three stable states of the circuit are (i) VT1 and VT3 on with VT2 off, (ii) VT2 and VT3 on with VT1 off, and (iii) all transistors off.

Figures 4, 5:
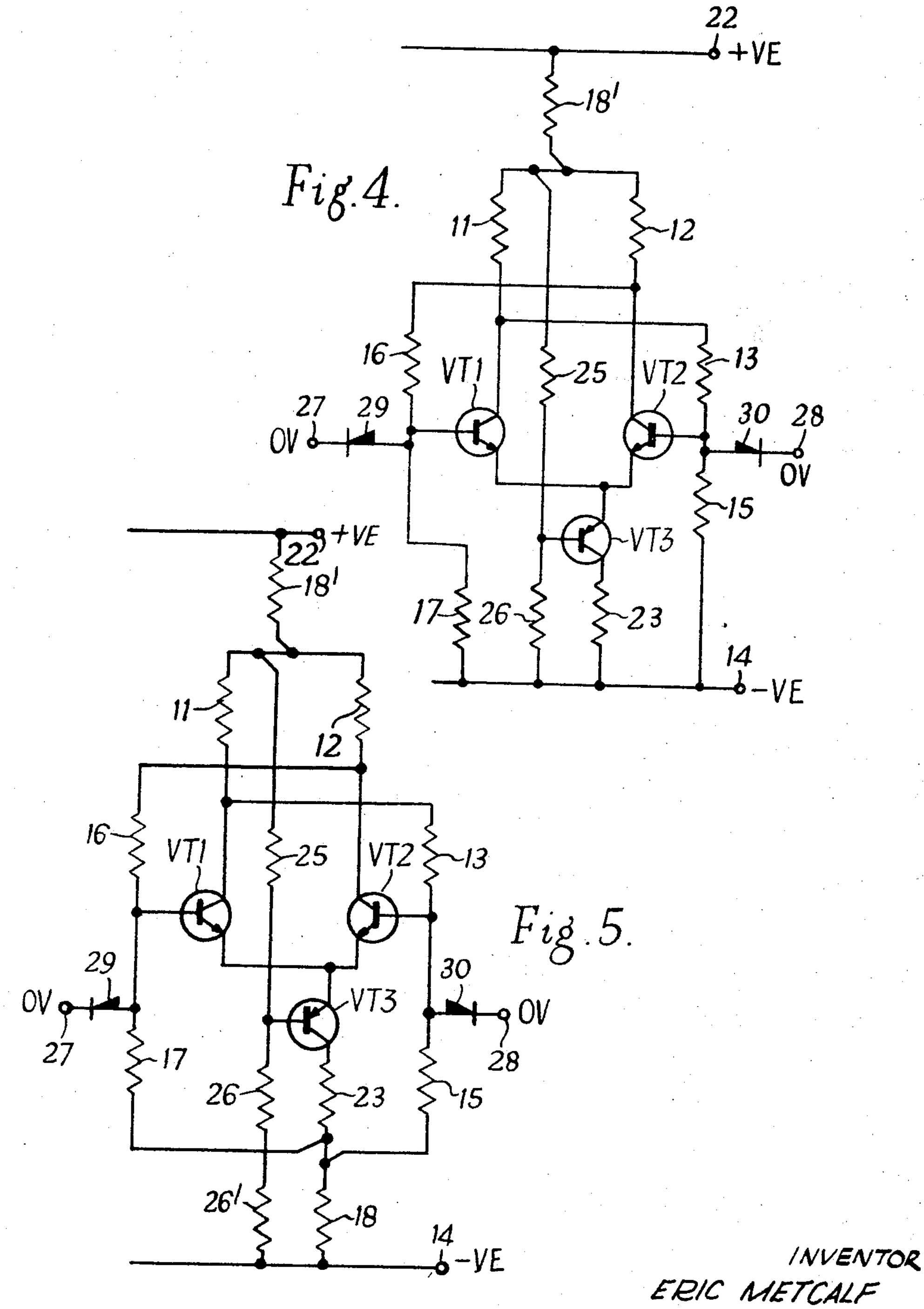

Referring to FIG. 4 this shows a modification of FIG. 3 in which the resistor 18 of FIG. 3 is removed and a resistor 18' is connected in the common lead to the collector loads 11 and 12 of the transistors VT1 and VT2. The resistors 15 and 17 are connected direct to the terminal 14 and the base of the transistor VT3 is coupled by a potential divider 25, 26 to the junction of the resistor 18' with the resistors 11 and 12. Two trigger terminals 27 and 28 are connected to the bases of the transistors VT1 and VT2 respectively through rectifiers 29 and 30.

In operation all three transistors are switched off by the simultaneous application of like suitable trigger pulses to the terminals 27 and 28. Either one of the transistors VT1 and VT2 can then be switched on by the application of a suitable triggering pulse to its associated input terminal 27 or 28 which also causes the transistor VT3 to be switched on.

Referring to FIG. 5 the modifications in this circuit over FIG. 4 are that the resistor 18 is reinserted in series with the resistor 23; the resistors 15 and 17 are connected to the junction of the resistor 23 with the resistor 18 and an additional resistor 26' is inserted in series with the resistor 26. Triggering pulses are applied as in FIG. 4 to both terminals 27 and 28 or to a selected one of them.

Referring now to FIG. 6 this is part of a circuit diagram of an arrangement for controlling a glow-discharge numeral indicator.

Glow-discharge numeral indicators are well-known and comprise ten cathode wires in the shapes of 0 and 1 to 9 respectively in an envelope containing a common anode and an inert gas such as neon at low pressure. In operation whichever cathode wire is negative with respect to the anode by more than a given voltage is surrounded by a glow discharge. The other cathodes are maintained at a potential nearer the anode potential than is required to strike the discharge.

In current practice it is usual to use a binary-coded four-stage decimal counter as a driver. This is coupled to a staticizer comprising four bi-stable circuits connected to the four counter stages respectively of the counter followed by a diode decoder for converting the binary coded decimal output of the staticizer to a decimal output and ten transistor power amplifiers connected between the ten outputs of the decoder and the ten cathodes of the indicator.

By means of five tri-stable circuits according to the present invention we can perform all the functions of the staticizer, the decoder and the ten power amplifiers.

One of the five tri-stable circuits is shown in FIG. 6 connected to cathodes 4 and 5 of a glow-discharge numeral indicator. The other four tri-stable circuits are connected respectively to the pairs of cathodes 0 and 1, 2 and 3, 6 and 7, and 8 and 9 of the indicator 31.

The input terminals 27 and 28 are connected through resistors 32 and 33 respectively to their associated rectifiers 29 and 30. A terminal 34 is also connected to the rectifiers 29 and 30 through resistors 35 and 36 respectively shunted by capacitors 37 and 38. Three further terminals 39, 40 and 41 are connected through resistors 42, 43 and 44 and then through a common resistor 45 to the input terminal 34. The terminal 14 is held at −18 volts; the terminal 22 at +100 volts and the common anode of the indicator 31 is connected through a resistor 46 to a terminal 47 at +250 volts. The junction of the resistors 42, 43 and 44 with the resistor 45 is connected to the base of the transistor VT3 and through a catching diode 48 to a terminal 49 at −6 volts. The junction of the emitters of the transistors VT1, VT2 and VT3 with one another is connected through a further catching diode 50 to another terminal 51 also at −6 volts.

It will be remembered that the driver is a binary-coded decimal counter (not shown) which has therefore four stages providing counts of 0 or 1, 0 or 2, 0 or 4, and 0 or 8 respectively. The output taken from each stage is arranged to be zero volts or −6 volts. The state of the first counter, 0–1, represents an odd or an even count and two outputs are applied therefrom to the terminals 27 and 28, one of 0 volts and the other of −6 volts. If the count is even, 0 volts are applied to terminal 27 and −6 volts to terminal 28 and vice versa for an odd count.

In addition three inputs, each of 0 or −6 volts, are applied from the other three counters to the terminals 39, 40 and 41 of each of the five tri-stable circuits. If the count is 0 or 1, the inputs to all the terminals 39, 40 and 41 of the tri-stable circuit controlling the 0 and 1 cathodes of the indicator are supplied with −6 volts whereas in all other tri-stable circuits the inputs to the corresponding terminals are 0 volts. If the count is, say, 2 or 3 the inputs to the terminals 39, 40 and 41 of the corresponding tri-stable circuit are −6 volts and at least one of the terminals 39, 40 and 41 in the other tri-stable circuits is at 0 volts—and so on. Thus it is arranged that at least one of the terminals 39, 40 and 41 of every tri-stable circuit is at 0 volts except the tri-stable circuit which is to control the cathode corresponding to the count which has −6 volts on each of its terminals 39, 40 and 41.

The tri-stable circuit shown is for controlling the cathodes 4 and 5 and hence for all counts other than 4 or 5 at least one of the terminals 39, 40 and 41 shown is at 0 volts.

The terminal 34 is a terminal to which a staticizer pulse of −18 volts is applied and the component values in the circuit are so chosen that if all terminals 39, 40 and 41 of a circuit are at −6 volts when the −18 volts staticizer pulse is applied the transistor VT3 is bottomed, whereas if any of the terminals 39, 40 and 41 are at 0 volts on the occurrence of the staticizer pulse, all three transistors VT1, VT2 and VT3 are turned off and the circuit remains in this state.

Referring again to the case where all the terminals 39, 40 and 41 shown are at −6 volts for a count of 4 or 5 the staticizer pulse turns off transistors VT1 and VT2 and bottoms VT3. When the staticizer pulse ends either VT1 or VT2 will be turned on depending upon whether the count is 4 or 5.

The cathodes 4 and 5 of the indicator are connected to the collector electrodes of the transistors VT1 and VT2 respectively and hence whichever of these two transistors is switched on will cause its associated cathode 4 or 5 to have its potential depressed and strike the glow discharge.

Referring now to FIG. 7 this is a diagram of a tri-stable circuit according to the invention suitable for use in a ring counter. The circuit shown in FIG. 7 is based on the circuit of FIG. 3 and has an additional input terminal 48 coupled through a capacitor 49 to the base of the transistor VT1. A capacitor 50 couples the collector of the transistor VT2 to an output terminal 51 and a capacitor 52 is connected across the resistor 52.

As many of the circuits shown in FIG. 7 as are required in a given ring—for example 10—are connected in cascade with the output terminal 51 of each connected to the input terminal 48 of the next.

The counter starts with the transistors of all stages in the ring switched off except one which has its transistor VT3 on together with the associated transistor VT1 or VT2.

Transfer pulses are applied to all stages simultaneously and can be applied, for example, in any of the following ways:

(a) to pull the potential of the terminal 22 to zero,
(b) to pull the base electrodes of all transistors VT1 and VT2 negatively. The common connection for this can be coupled to the base electrodes through separate diodes,
(c) to pull the common emitter connections negatively from a common terminal coupled to the common emitter connections through separate diodes,
(d) to drive all the terminals 24 positively through a separate diode for each,
(e) to pull the point P in all circuits negatively through separate diodes.

The effect of the transfer pulse is momentarily to switch off all transistors which are on. Assume the transistors VT2 and VT3 in FIG. 7 are on before the transfer pulse is applied. The transfer pulse switches them off and the potential of the output terminal 51 rises but the input capacitor 49 of the next stage does not discharge immediately and after the transfer pulse has ended will still be driving the base of its associated transsitor VT1 positively turning on this transistor and drawing current through its associated transistor VT3.

The next transfer pulse switches off VT1 and hence causes VT2 to be switched on when the transfer pulse ends by the charge in the capacitor 52.

This sequence is repeated stage by stage around the ring.

Referring to FIG. 8 this is a diagram of a penta-stable circuit. It is based upon FIG. 5 and has an additional transistor VT4 connected as shown and functioning with VT3 as a second bi-stable circuit. A resistor 23′ is connected between the collector of VT4 and the resistor 18 and the base of VT4 is coupled by a potential divider 25′, 26′ between the resistor 23 and the resistor 18′. The resistor 26 is connected to the collector of VT4. Assuming all transistors to be off and a negative pulse to be applied to the terminal 27 VT3 and VT2 are switched on. Subsequently a negative pulse applied to the terminal 28 switches off VT2 and switches on VT1. Negative pulses applied simultaneously to 27 and 28 turn all transistors off. A negative pulse applied to 28 switches on VT4 and VT1 and a subsequent negative pulse applied to 27 switches off VT1 and switches on VT2.

Thus the five stable states are provided by either VT1 or VT2 with either VT3 or VT4 on, and all four transistors off.

What is claimed is:

1. A poly-stable transistor circuit comprising
(a) two transistors of like conductivity type interconnected to provide a bi-stable circuit,
(b) a common emitter circuit for said two transistors,
(c) two further transistors of complementary conductivity type to the said two transistors,
(d) said two further transistors being interconnected to provide a further bi-stable circuit,
(e) a common emitter circuit for said two further transistors,
(f) means interconnecting the emitters of the said two further transistors to the emitters of said two transistors,
(g) means to select any one of the following conductivity states of the four transistors: $A+C$ conductive, $B+C$ conductive, $A+D$ conductive, $B+D$ conductive, and $A+B+C+D$ non-conductive, where A and B are the said two transistors respectively, and C and D are the said two further transistors.

References Cited

UNITED STATES PATENTS

| | | | |
|---|---|---|---|
| 3,042,810 | 7/1962 | Rochelle | 307—88.5 |
| 3,172,061 | 3/1965 | Malinowski | 307—88.5 |
| 3,178,592 | 4/1965 | Fischer et al. | 307—88.5 |
| 3,181,011 | 4/1965 | Durio | 307—88.5 |
| 3,191,073 | 6/1965 | Mooney | 307—88.5 |
| 3,213,294 | 10/1965 | Okuda | 307—88.5 |
| 3,225,215 | 12/1965 | Winter | 307—88.5 |

ARTHUR GAUSS, *Primary Examiner.*

H. DIXON, *Assistant Examiner.*